United States Patent [19]

Finegold et al.

[11] Patent Number: 4,602,270

[45] Date of Patent: Jul. 22, 1986

[54] GATE ARRAY WITH REDUCED ISOLATION

[75] Inventors: Leonard S. Finegold; Christopher A. Freymuth, both of Colorado Springs, Colo.

[73] Assignee: United Technologies Corporation, Hartford, Conn.

[21] Appl. No.: 735,405

[22] Filed: May 17, 1985

[51] Int. Cl.[4] .......................................... H01L 29/78
[52] U.S. Cl. ..................................... 357/42; 357/41; 357/45; 357/46; 357/48; 357/68
[58] Field of Search .................... 357/42, 41, 45, 46, 357/48, 68

[56] References Cited

U.S. PATENT DOCUMENTS 4,161,662 7/1979 Malcolm et al. ...................... 357/42

Primary Examiner—Edward J. Wojciechowicz
Attorney, Agent, or Firm—Eric W. Petraske

[57] ABSTRACT

An improved gate array employs long strips of gates instead of current blocks. Isolation of selected adjacent circuits is provided by connecting positions of the area between transistor gates to VCC or ground. Room for passage of connecting lines across a column is provided by shifting the positions of circuits along a column to open a sufficient quantity of unused gates.

3 Claims, 15 Drawing Figures

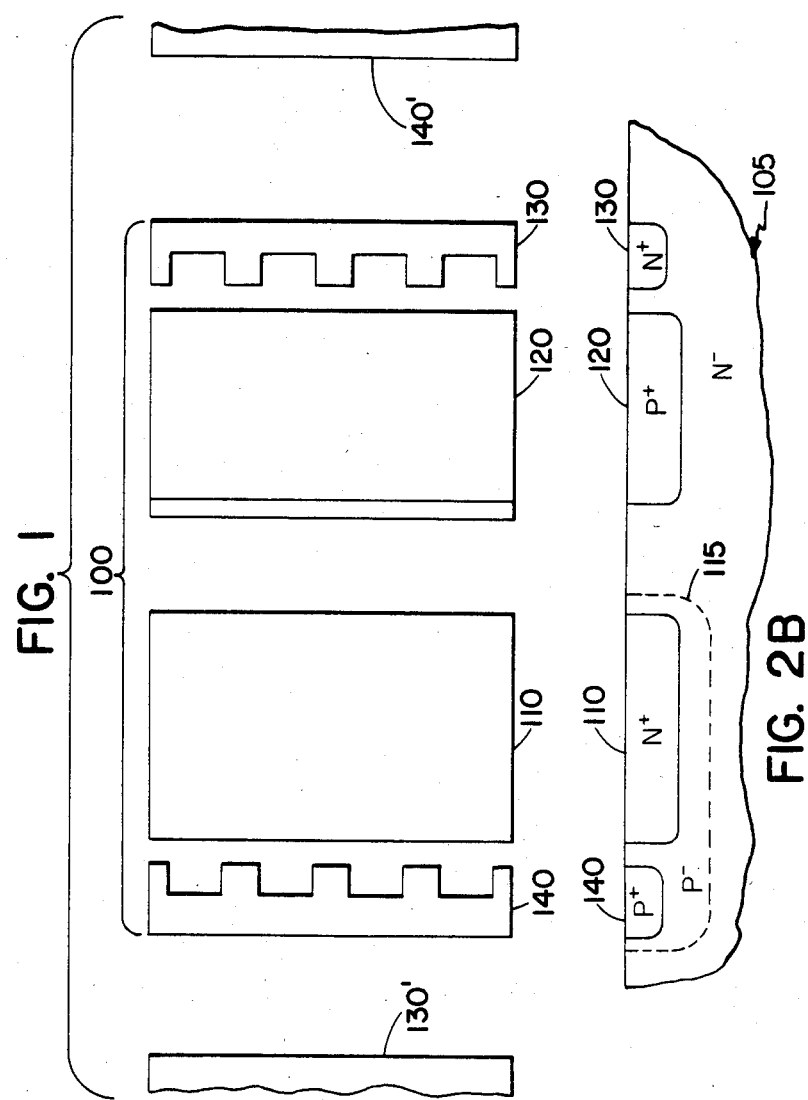

GATE ARRAY WITH REDUCED ISOLATION

DESCRIPTION

1. Technical Field

The field of the invention is integrated circuit gate arrays, in particular those with CMOS structure.

2. Background Art

CMOS gate arrays in the prior art have conventionally been arranged in long columns made up of separate blocks of 2, 3, or 4 transistor pairs separated by a space for the provision of horizontal wiring across the columns. This arrangement has used the silicon space relatively inefficiently.

It is known to use a continuous strip of transistor pairs in which each logic function is bounded top and bottom by a pair of inactive transistors that are made inactive by tying the gates of the transistors to a supply voltage. A drawback of this arrangement is that two rows of transistor pairs are wasted for each small logical block. It is also known to run interconnection wires vertically along the length of a column in the space provided for that purpose between the columns.

DISCLOSURE OF INVENTION

The invention relates to a CMOS gate array having a continuous strip of gates grouped into logic modules that are isolated by a fixed electrical contact between one terminal (source or drain) and a power supply voltage (VCC or ground).

A feature of the invention is that logic modules are separated by variable amounts vertically, as is convenient for horizontal routing across the columns.

Another feature of the invention is the provision of routing lines to be run within a column, parallel to the column axis.

BRIEF DESCRIPTION OF DRAWINGS

FIG. 1 illustrates the diffusion areas within a gate array substrate.

FIG. 2A and 2B illustrates a portion of a partially completed gate module showing diffusion areas and the placement of the gates.

BEST MODE OF CARRYING OUT THE INVENTION

In the field of gate arrays, it is conventional to prepare an intermediate form of the final circuit, including the prepared substrate having diffusion areas for N-Channel and P-Channel transistors together with diffusion areas for the power supply voltage and ground. Groups of polysilicon gate electrodes are placed at selected positions along these columns of the active area, after which a diffusion step completes the intermediate form. A gate array is then customized by connecting the transistors up in stock elementary circuits, such as inverters, NAND gates and the like to form more complicated logical units which together comprise a whole system. The schematic of a system will be provided by the customer's systems engineer and the routing of the interconnection wires will be done by the supplier of the gate arrays, either manually or with the aid of a computer aided design system. Gate array designers have constantly attempted to use the silicon area as efficiently as possible in order to achieve a compact layout.

Figure 6:
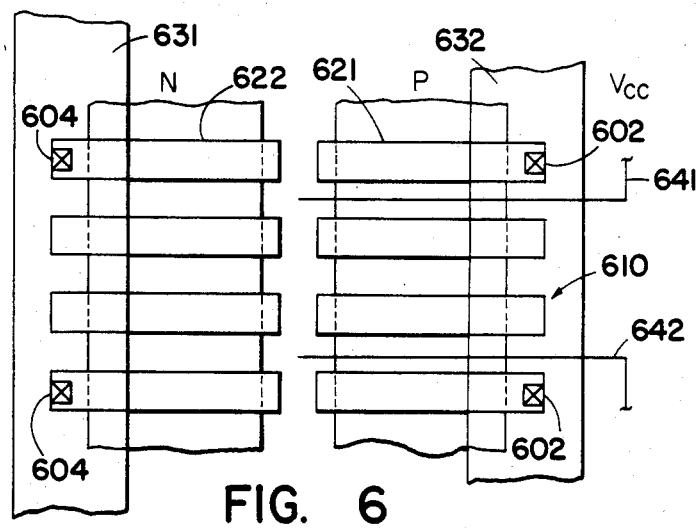
FIG. 6 illustates a logic module from the prior art.

Referring now to FIG. 6, there is shown a portion of a logical module constructed according to the principles of the prior art in which N-Diffusion 622 and P-Diffusion 621 are used to form N-Channel and P-Channel transistors respectively. To the left of diffusion 622 is a ground strip 631 and to the right of diffusion 621 is a power supply strip 632 indicated by VCC and conventionally carrying +5 volts. The ground and VCC strips are formed in the first level of metal and extend over the polycrystalline (poly) gate electrodes. At the center of the module is a set of four transistors, indicated collectively by the numeral 610, that may be interconnected to form a conventional dual inverter. The row of transistors at the top of the module and at the bottom of the module are dedicated, according to the principles of the prior art, solely for the purpose of isolating logic unit 610 from the effects from neighboring logic units. This is done by tying the gate of an N-Channel transistor to ground strip 632 through connection 604, which is a conventional contact extending from the polysilicon gate to the metal 1 bus. In the case of the P-Channel transistor, connection 602 similarly connects the gate to the VCC bus 631. With the gates so connected, both the N and P transistors are turned off permanently, so that no signals can pass from adjacent circuits into circuit 610. This figure also shows two schematic connecting wires, 641 and 642, that are used for input and output respectively and extend from the interior of circuit 610 to a reserved space between adjacent columns. This form of layout has the considerable disadvantage that half the transistors, in this circuit, are wasted, since they are used only for isolation. Also, the neighboring circuits on the top and bottom will have isolation transistors, so that two consecutive transistor pairs will be wasted.

Referring now to FIG. 1, there is shown a substrate of a gate array having active areas formed in it in preparation for the remaining steps. The central portion, indicated by the numeral 100, consists of N-Channel active area 110, a P-Channel active area 120, an active area for the ground electrode 140, and a fourth active area for the supply voltage 130.

Figure 2A:
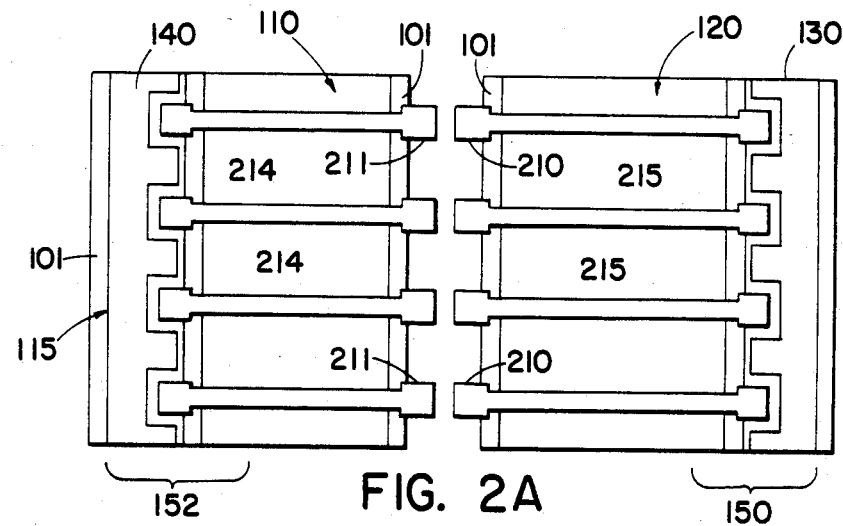

FIG. 2A illustrates the next step in the formation of a gate array according to the invention in which the polysilicon gate electrodes have been placed over active areas 110 and 120. The same areas, 110, 120, 130 and 140 are shown together with a set of N-Channel gate electrodes 211 and a set of P-Channel gate electrodes 210. Transistors have been formed by implanting the exposed regions of channels 110 and 120 in a conventional process. Strips 101 show the edge of the active area and strip 115 shows the edge of the P-well for diffusion 140 and 110. The area between adjacent N-Channel gate electrodes where a combined source and drain has been formed is indicated by the numeral 214 and the corresponding area between adjacent P-Channel gate electrodes is indicated by the numeral 215.

FIG. 2B shows in cross section the diffusions for transistors and for conductive buses formed in substrate 105. Illustratively, the substrate is doped N− with a resistivity of 2–4Ω-cm, the VCC diffusion 130 is doped N+, the P-Channel diffusion 120 is doped P+ and the N-Channel and ground diffusions are formed within a well, 115, doped P− and are respectively N+ and P+. Those skilled in the art will readily be able to form alternate sets of diffusion parameters with a P substrate and the like. Illustratively, the resistivity of the N− substrate is 17 ohms per square and the doping of the diffusion areas are respectively: 110 and 130—phosphorous at $1.5 \times 10^{16}/cm^2$; 120 and 140—boron at $7 \times 10^{15}/cm^2$. To the right and left of the set of diffusion lines 100 are indicated diffusion lines 140' and 130' indicating the respective edges of adjacent columns. The clear area, between adjacent columns is used for interconnection lines extending along parallel to the column axis.

In an illustrative embodiment, the overall width of a gate electrode overlapping the diffusion is illustratively 45 micrometers for the N gate and 51 micrometers for the P-gate; the length of a gate electrode along the axis is 3 micrometers; the spacing between adjacent gate electrodes is 3 micrometers, the width of the diffusions 110 and 120 is 31 and 37 micrometers respectively and the width of the diffusions 130 and 140 is 8.3 micrometers. Split gates are used in this embodiment in order to provide flexibility. It may be convenient to extend a metal bus from the corresponding VCC or ground diffusion along the column in order to make a contact vertically to the gate electrodes. The location of such buses are indicated by the brackets 150 and 152. The actual buses are not shown in order to avoid a cluttered drawing.

Figure 3A:
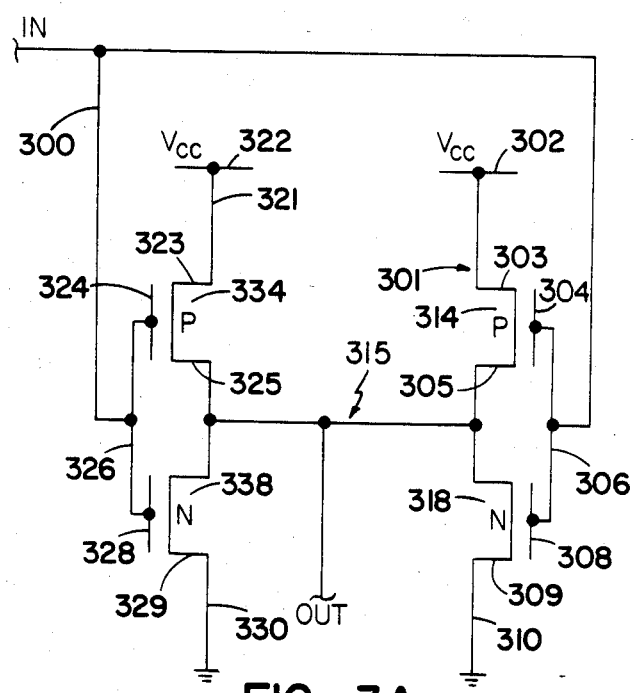
FIGS. 3A and 3B illustrates a schematic and a layout of a dual inverter circuit.

For purposes of illustration, a simple logic circuit, the dual inverter, has been selected. The schematic diagram of this circuit is shown in FIG. 3A, in which two transistor pairs of P-Channel and N-Channel respectively are connected between VCC terminals 302 and 322 and ground terminals 310 and 330. In the right-hand inverter, denoted by the numeral 301, the common gate terminal, 306, connects P-Channel gate 304 with N-Channel gate 308. The drain of the first P-Channel transistor is connected to the drain of the first N-Channel transistor at connection strap 315. This is the conventional output of the inverter.

Correspondingly, the elements of the left-hand inverter, denoted collectively by the numeral 321, have corresponding numbers increased by 20.

Figure 3B:
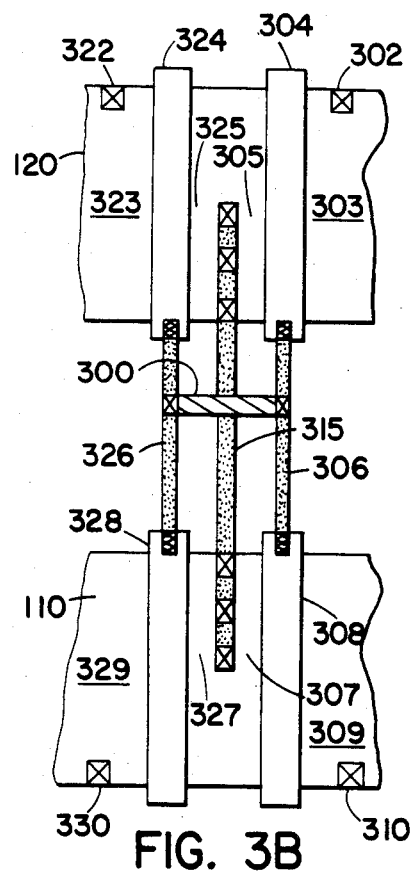

The layout of this dual-inverter circuit is shown in partially schematic, partially pictorial form in FIG. 3B. The arrangement of components in the two figures is generally the same, with the result that the two diffusion strips 110 and 120 are shown as horizontal, instead of vertical. Corresponding elements in FIGS. 3B and 3A have the same identifying numerals.

In the upper right hand corner of FIG. 3B, contact 302 makes electrical contact between a first level metal VCC bus that is not shown in FIG. 3B for clarity, but which travels horizontally in the figure overlapping part of diffusion 120 and part of VCC diffusion 130. The area 303 of the diffusion 120 to which it makes contact is the source of P-Channel transistor 314. This "pegging" of the diffusion to VCC prevents signals from being transmitted to or from transistor 314 and any transistor that may be placed next to it on diffusion 120 to the right of contact 302. Similarly, source 309 of transistor 318 is pegged to ground by contact 310, also making contact to a metal bus that is not shown. Gates 304 and 308 are shown as connected by strap 306, which is formed in the first layer of metal and makes contact with the polysilicon gates at the points indicated with cross hatching. The layout for inverter 321 is corresponding, with contact 322 pegging source 323, contact 330 pegging source 329 and strap 326 connecting gates 324 and 328. Because of the symmetry of the layout, all four drains, 305, 325, 307 and 327 are tied together by strap 315, which is the output node. Three contacts are used in each end of strap 315, for greater reliability and lower impedance. Strap 315 will have an output connection conventionally made by a via up to the second level of metal and/or by extension of strap 315 in the first level over any of the gates to a desired location within the column.

In the schematic diagram of FIG. 3A, straps 306 and 326 are shown as connected by a long line to form an input node 300. For layouts, of course, a short line is preferred and strap 300 may be used. As illustrated, strap 300 is on the second level of metal (indicated by diagonal striping), making contact with the first-metal straps 306 and 326 by vias indicated. A connection could also be made on the first-level metal by extending either of straps 306 or 326 around output strap 315 and over the intermediate diffusion to the other gate pair. The connecting strips have been shown as having less width than the gates in order to avoid overlapping lines in the figure. In a preferred embodiment the widths of the metal lines are the same 3 micrometers as the gates.

A considerable advantage provided by this embodiment of the invention is the ability to route wires along the interior of a diffusion column. FIG. 4A illustrates allowed horizontal routing paths in a prior art embodiment that uses blocks of gates. Note that only between blocks may a horizontal routing path extend directly across the column (450). Within a block, the lines (shown schematically as single-width lines) enter between gates and bend to avoid the row of contact holes between gates, travelling above a gate for most of its length, as shown with respect to line 452 in FIG. 4A. In the prior art, all legal positions for contacts from the first-level metal to the diffusion are opened and contacts are formed during the metal deposition step, whether they are used for interconnections or not. In the present invention, as shown in FIG. 4B, there are legal paths both above gates (460) and between gates (470), giving twice as many potential positions. If some contact position is in use to carry a signal down to the diffusion, then other signals will be routed around that position, but otherwise routing may be done freely over contact positions. The way in which this is implemented is to include the insulator between first-level metal and diffusion as one of the personalization layers and only to open contact apertures at those contact positions that are going to be used.

Figure 8:
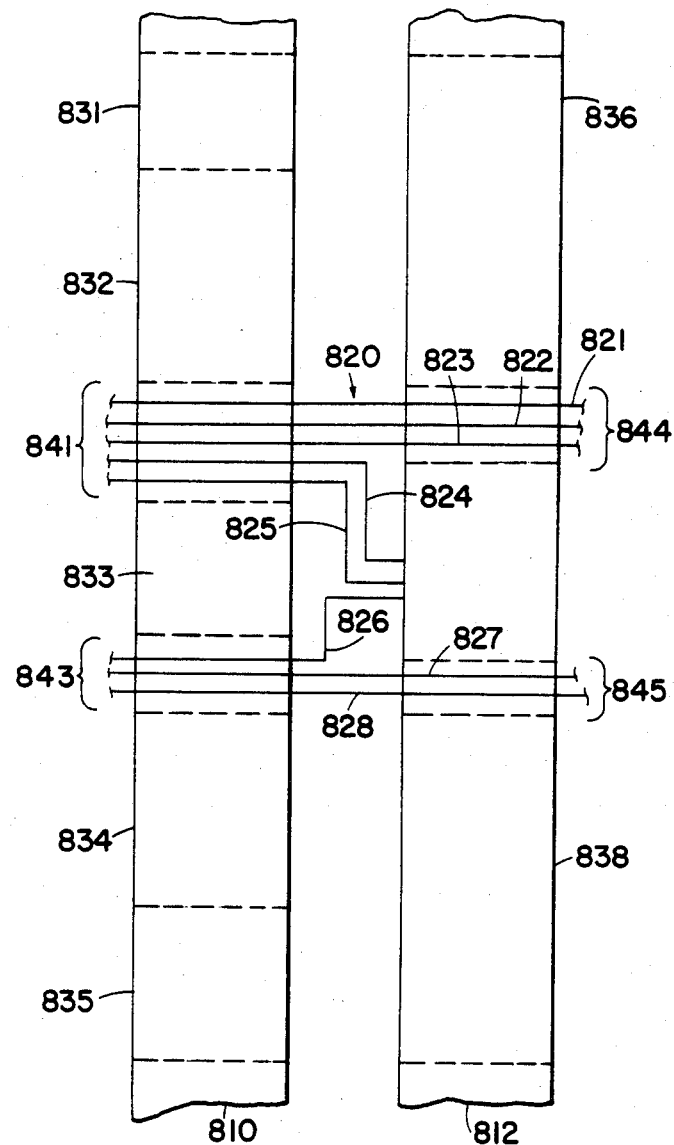
FIG. 8 illustrates a flexible block arrangement according to the invention.

In the case of intercircuit wiring that crosses a column, the prior art was confined to defined spaces between blocks. In the present invention, there is a further degree of flexibility in that spaces for horizontal intercircuit wiring are only provided where they are used and then provided in a size as large as required. This is a result of the use of a continuous column, since a space between circuits may be opened up by sliding the remainder of the column up or down by the amount required. Referring now to FIG. 8, two adjacent columns, 810 and 812, have a number of logic blocks 831 and 838 positioned at irregular positions, in order to conserve space. Some blocks, such as 831 and 832 are adjacent, while others, such as 832 and 833 are displaced in order to make room for the set of wires 821–825 that pass through gap 841 between blocks 832 and 833. It may be noted that gap 844 is smaller than gap 841 and gap 845 is smaller than gap 843, in order to take advantage of the change in the number of wires passing through the different gaps.

Figure 4C:
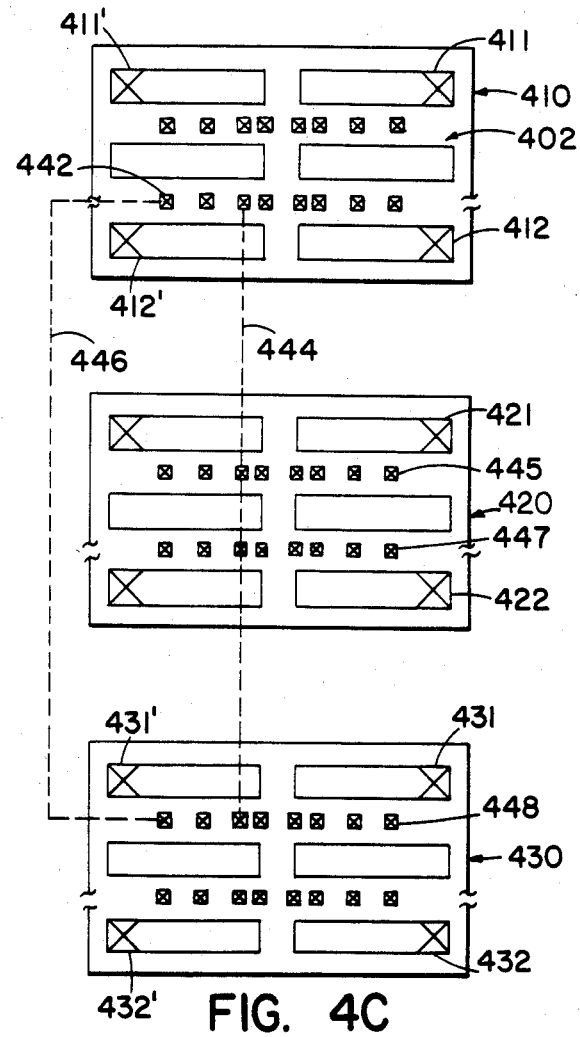
FIGS. 4A, 4B, 4C and 4D illustrate allowed routing paths in the prior art and according to the subject invention.
Figure 4A:
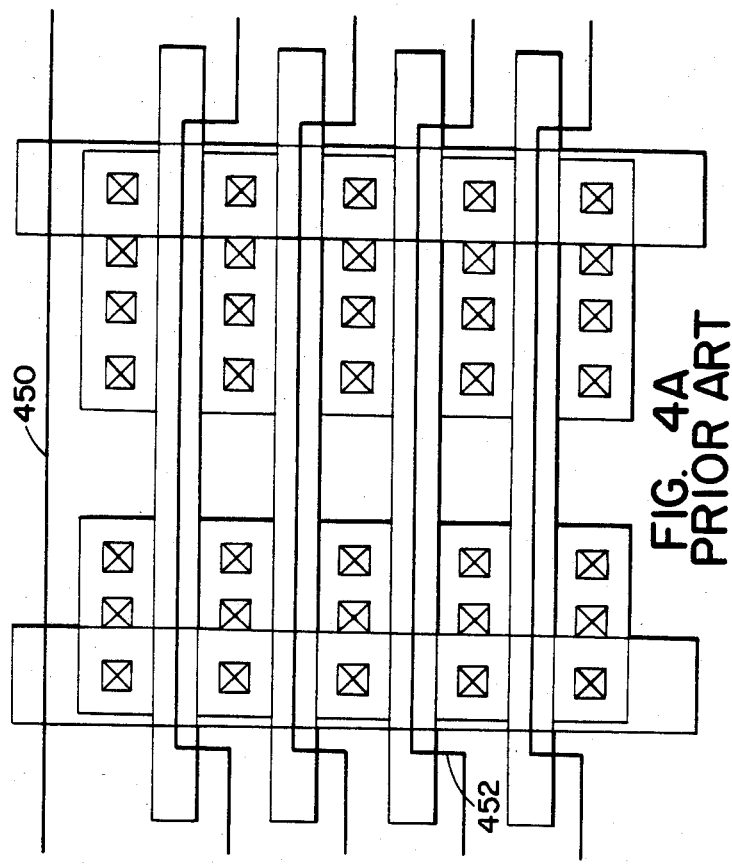
Figure 4B:
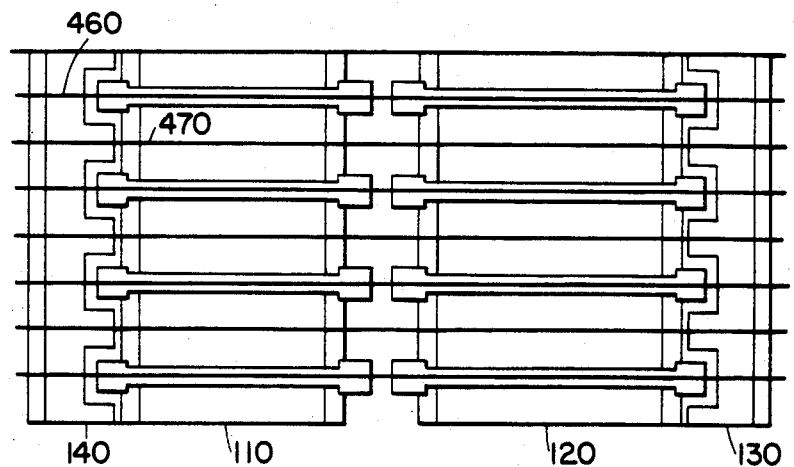

FIG. 4C illustrates a disadvantage of the prior art with respect to routing wires along a column. In this case, three blocks 410, 420, and 430 are shown, each of which has upper and lower pegged gates for isolation, 411, 421, 431 and 412, 422 and 432. Each block has a set of contacts, denoted collectively by numeral 402, that fill all six of the legal positions between each gate. Each block has broken edges to indicate that additional gate pairs are contained within the block. Blocks 410 and 430 are assumed to contain circuits, while block 420 is blank. The problem is to route a wire from contacts 442 and 442' in block 410 to contacts 448 or 448' in block 430. If the direct path indicated by the dotted wire 444 were followed, then wire 444 would make contact with all the contacts (445, 447 et cetera) in that position, with the result that, even though there is no interference of signals because the contacts 442 and 448 are at the edges of their blocks and contacts 445 and 447 are unused, the capacitance on wire 444 arising from electrical contact with the substrate through the contacts 445 and 447 within block 420 would be so great that this path could not be used. For the prior art, then, it is necessary for reasonable electrical values, that a path such as 446 be taken. The same considerations apply whether the path in question is inter- or intra- circuit.

According to the invention, contacts are placed in permitted positions only when they are to be used, so that wires can be routed vertically (along the length of a column) on the first level of metal, with the only constraint being the avoidance of active contacts that are carrying signals. This may be expressed by saying that contacts are formed in a subset of the permitted contact positions, so that the insulation layer through which the contacts pass is a personalization layer, in contrast to the prior art.

Figure 4D:
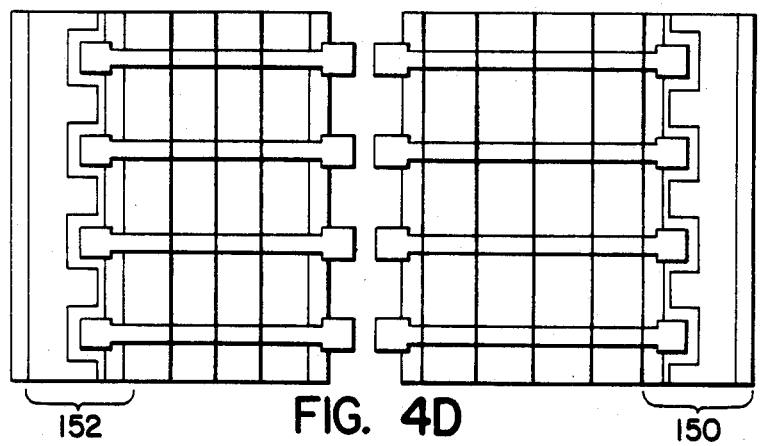

FIG. 4D illustrates permitted routing positions for wiring along the length of a column in the first level of metal. The number of permitted positions (nine) is greater than or equal to the numbers in the prior art. The positions are asymmetric because the N-channel transistors on the left are actually less wide than the P-channel transistors on the right, so that four positions would mean that connections would be difficult to make.

Figure 5A:
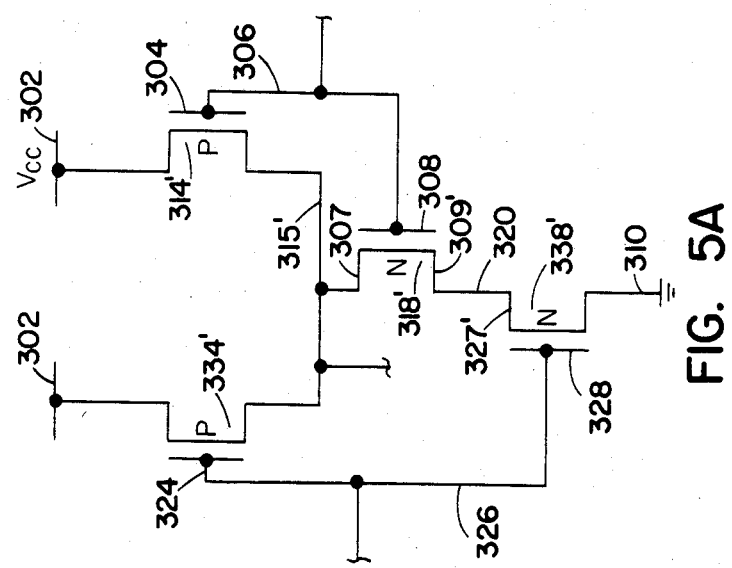
FIGS. 5A and 5B illustrate a schematic diagram and a layout of a two-input NAND gate.
Figure 5B:
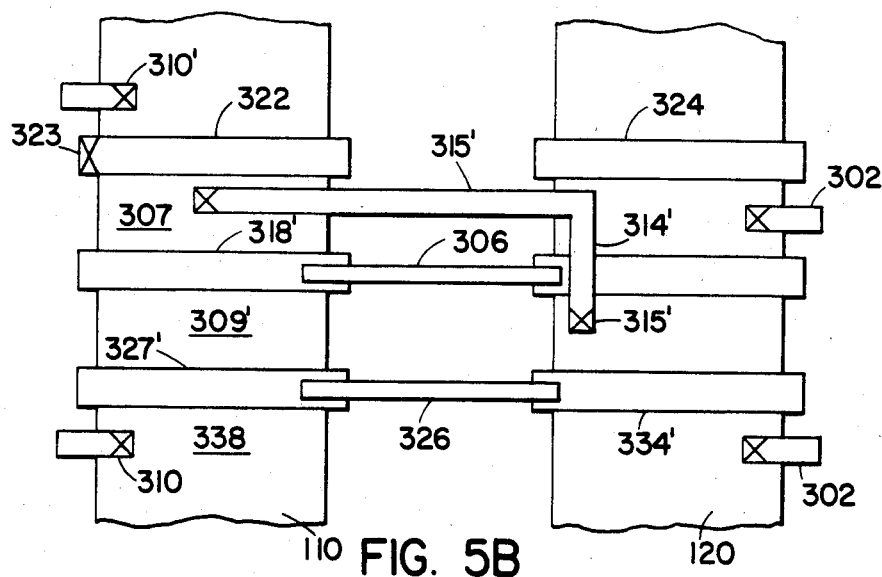

Referring now to FIG. 5, FIG. 5A shows a schematic diagram of a two-input NAND gate. The components are labeled, as a convenience, to emphasize the relationship of this NAND gate to the dual inverter of FIG. 3. FIG. 5B shows the layout of the circuit of FIG. 5A. It is not quite as compact as the layout of FIG. 3B because the fact that N-Channel transistors 338' and 318' are in series means that output node 315 must extend beyond the 4-gate block as shown in the upper left corner of the figure, where first-level metallization 315' makes contact with drain 307 of transistor 318'. This piece of diffusion 307 will have a signal on it, in contrast to the outer pieces of FIG. 3B. Isolation is provided by typing gate 322 to VSS with contact 323, so that drain 307 is isolated. Gate 324 may be tied to VCC similarly, but that is not necessary since contact 302 isolates transistor 314' and gate 324 may be useful in the adjacent circuit.

Figure 7A:
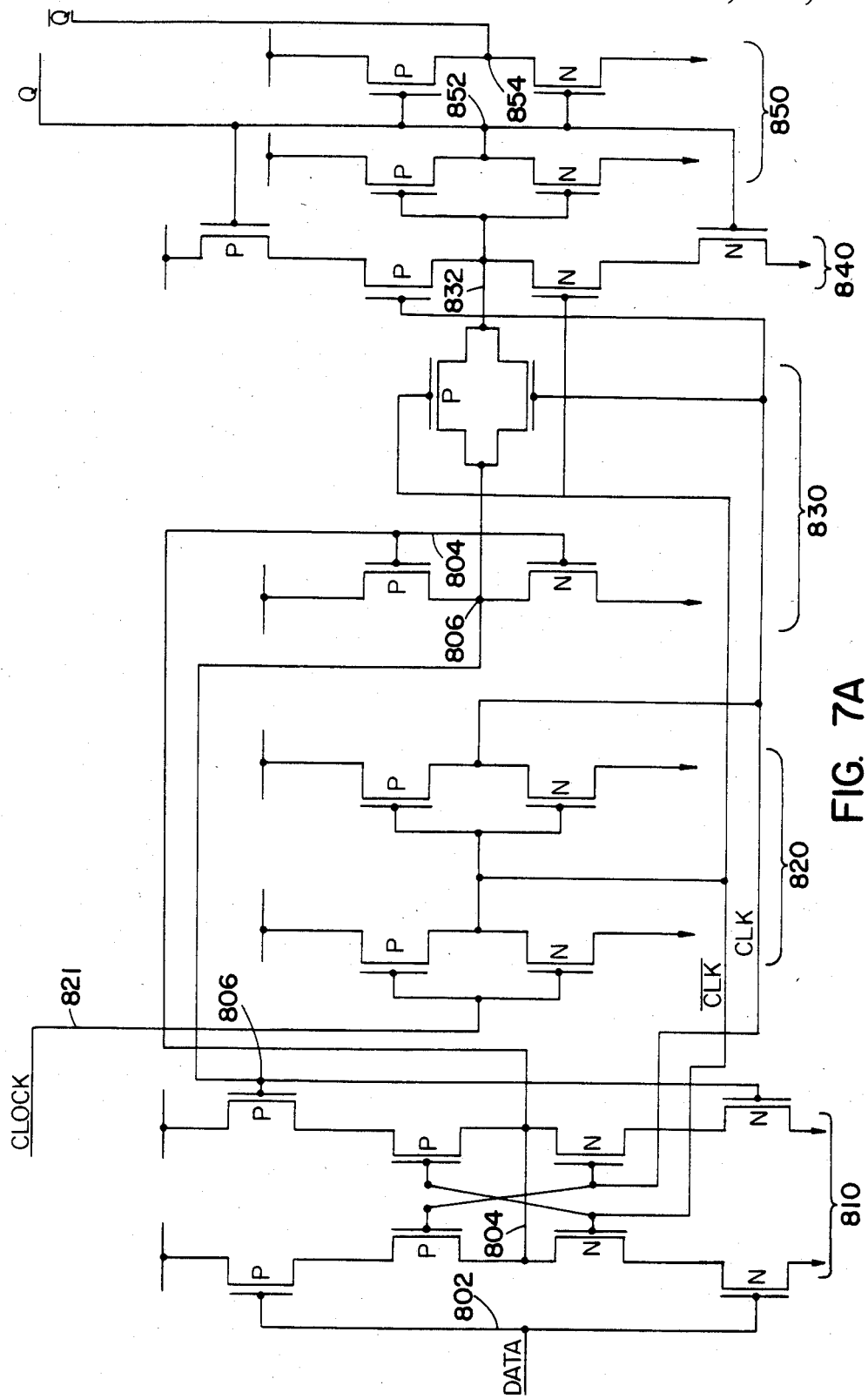
FIGS. 7A and 7B illustrate a schematic diagram and a layout of a dual flip-flop.
Figure 7B:
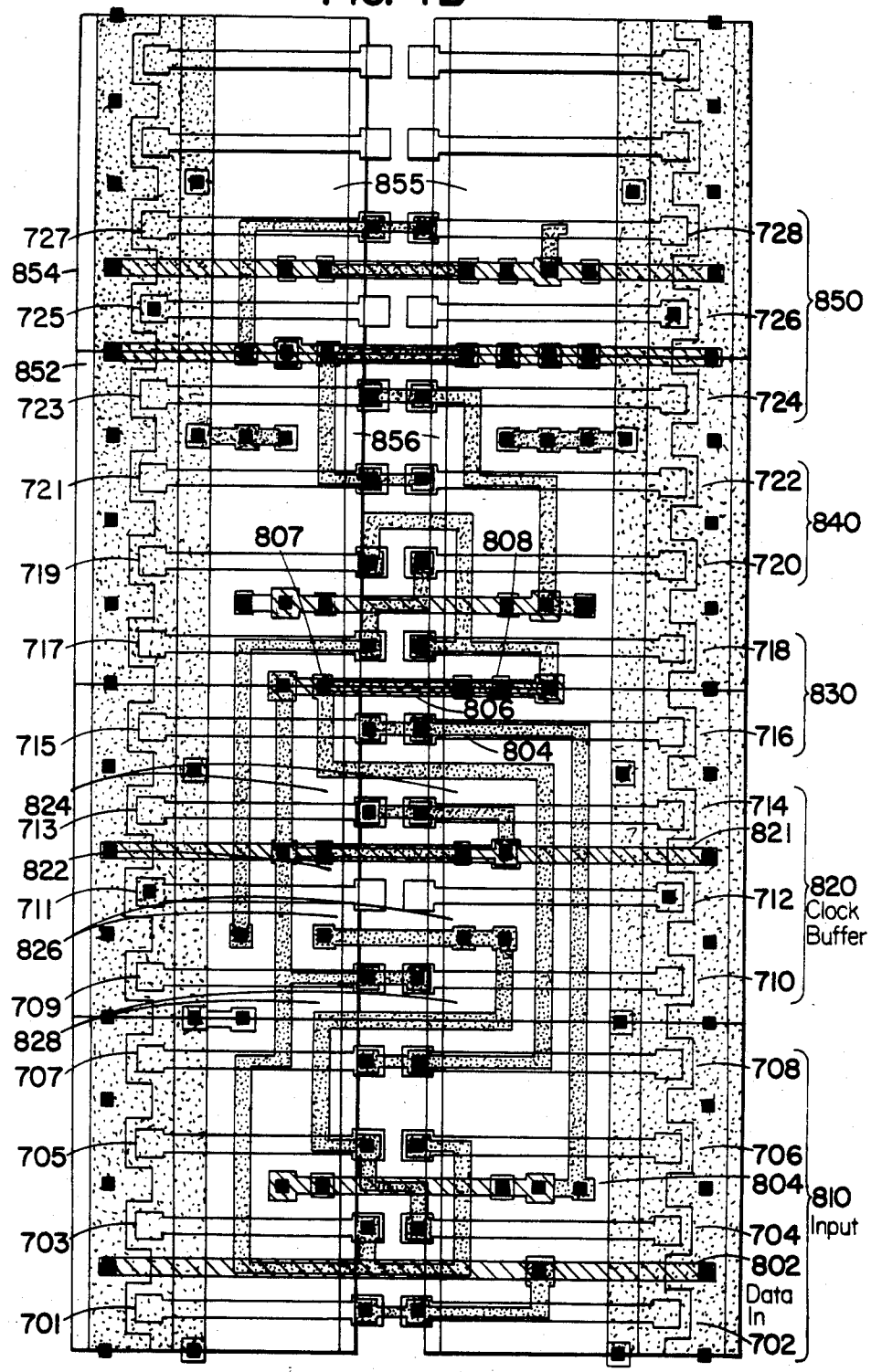

FIG. 7B shows a layout of a more complex circut, a D flip-flop that is illustrated schematically in FIG. 7A. Corresponding portions 810, 820, 830, 840 and 850 are labelled in both figures. At the bottom of FIG. 7B, region 810 contains four transistor pairs 701 to 708 that make up the input stage consisting of a pair of tri-state inverters to clock data on data input node 802 into the flip-flop. Node 802 is both on a first-level metal connection above the gates of transistors 701 and 702 and also on a second-level metal strip that extends horizontally across the column in order to provide for external connections from either side. An intra-column connection could also be made from the next circuit below, of course. Node 804 is the common output node of the two tri-state inverters and also extends upward on the right side of FIG. 7B to contact the gates of transistors 715 and 716, which form the cross-coupled inverter that cooperates with the input inverter pair to latch the data. Output node 806 of this inverter extends back down next to node 804 to make contact with the gates of transistors 707 and 708. Node 806 extends horizontally in the allowed channel between transistor pairs 715–716 and 717–718 from contact 807 on the left to contact 808 on the right. The CLK bar line passes over node 806 on the second level of metal in this same channel, which makes for a compact layout and a crowded drawing. As a convention in this figure, lines that are actually superimposed are shown displaced for greater clarity. Directly above node 806 in FIG. 7B, pass transistor pair 817–818 clock data out of the latch to tri-state inverter 840 that maintains the output data stable when the switch formed by the pass transistor pair is open and assumes the high-impedance state when the pass transistor switch is closed. Output stage 850 generates Q and $\overline{Q}$ outputs and latches the output by the action of inverter 723–724 cross-coupled to tri-state inerter 840.

Both stages 850 and 820 (the clock buffer) consist of two inverters in series. In the clock buffer, transistor pair 711–712 is used to isolate the output of the first inverter of the pair at node 822 from the output of the second inverter at node 826. Regions 824 and 828 are used to provide the power supply (VCC and ground) connections both for the clock buffer. With this arrangement, clock buffer 820 has a symmetric layout that isolates the buffer from circuits immediately above and below and also provides for a shared power supply and ground contact at the top and bottom of the buffer. This is one further benefit of isolation according to the invention—the sharing of power supply contacts. Similarly, in the output stages transistor pair 725–726 isolates nodes 852 and 854 that form the Q and $\overline{Q}$ outputs, respectively. Regions 855 and 856 serve as the power supply connections for the output inverter pair, while region 855 is also available for sharing with an adjacent circuit.

This circuit covers an area containing 14 transistor pairs, all of which are used, and only two of which are used for signal isolation in the interior of the circuit. It has isolation contacts at the top and bottom that may be shared with neighboring circuits and it has all the intra circuit wiring within the column.

We claim:

1. An integrated circuit gate array comprising a semiconductor substrate, a set of active-area columns of active areas formed within said substrate comprising P and N-Channel active regions between conductive means for supplying power supply voltages at ground and at a predetermined voltage, the members of said set of active-area columns being separated by a set of intercolumn routing channels extending along and between neighboring columns, a set of gate pairs positioned above said P and N-Channel regions of said active-area columns, the gates of said gate pairs being adapted to form with said active areas a plurality of field effect transistors; and means for interconnecting said plurality of field effect transistors to form an integrated circuit comprising a predetermined set of subcircuits separated from one another by selected subcircuit isolation means, which means for interconnecting comprises:

a predetermined set of electrical substrate contacts extending, from selected contact positions within a set of permitted contact positions in said substrate, away from said substrate;

a set of first-level interconnections formed from conductive material and being routed in predetermined routing paths to make electrical contact with at least some of said predetermined set of electrical substrate contacts, whereby electrical connections to said substrate are made by at least some of said first-level interconnections;

a set of second-level interconnections disposed in predetermined routing paths for interconnecting selected components of said integrated circuit; and a set of vias for connecting selected points on selected ones of said second-level interconnections to selected points in a level below said second-level interconnections, said vias being located at selected via positions within a set of permitted via locations, in which integrated circuit;

at least one pair of first and second neighboring subcircuits extending along one of said set of active-area columns are separated by subcircuit isolation means comprising a predetermined pair of isolation regions of one of said active-area columns, said pair of isolation regions being formed by connecting said predetermined isolation regions to respective power supply means, thereby rendering said isolation region insensitive to electrical signals at neighboring points in said active area, whereby that gate of said first neighboring subcircuit closest to each of said predetermined isolation regions is the gate of a transistor having one terminal at the fixed potential of said power supply means and those corresponding gates of said second neighboring subcircuit closest to said predetermined isolation regions are also a component of a transistor having one terminal at the fixed potential of said power supply means, both of said terminals of said closest transistors being formed in said predetermined isolation region, whereby said gates closest to said isolation region have no inactive blocking gates between them.

2. A gate array according to claim 1, in which said set of electrical substrate contacts includes contacts formed at a selected subset of permitted substrate contact positions within said active-area columns, whereby capacitance from electrical connections between said first level interconnections and said active-area columns is reduced.

3. A gate array according to claim 1, further comprising a network of circuit interconnections, at least some of which extend from selected ones of said intercolumn routing channels to neighboring intercolumn routing channels, crossing over at least one active area column through a set of interconnection passageway spaces having a non-uniform extent along said at least one active area column, whereby space along said active area columns that is used for said circuit interconnections is reduced.

* * * * *